(12) United States Patent
Fujii et al.

(10) Patent No.: US 10,748,859 B2
(45) Date of Patent: Aug. 18, 2020

(54) POWER CONVERTING DEVICE

(71) Applicant: Mitsubishi Electric Corporation, Tokyo (JP)

(72) Inventors: Kenta Fujii, Tokyo (JP); Yuji Shirakata, Tokyo (JP); Masahiro Ueno, Tokyo (JP); Tomoaki Shimano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/029,120

(22) Filed: Jul. 6, 2018

(65) Prior Publication Data
US 2019/0287933 A1 Sep. 19, 2019

(30) Foreign Application Priority Data

Mar. 16, 2018 (JP) ................................. 2018-048940

(51) Int. Cl.
*H01L 23/04* (2006.01)
*H01L 23/62* (2006.01)
(Continued)

(52) U.S. Cl.
CPC .............. *H01L 23/62* (2013.01); *H01L 23/04* (2013.01); *H01L 23/3121* (2013.01); *H01L 23/3675* (2013.01); *H01L 23/49541* (2013.01); *H01L 24/32* (2013.01); *H01L 24/33* (2013.01); *H01L 24/40* (2013.01); *H01L 24/73* (2013.01); *H02H 7/1203* (2013.01); *H01L 2224/32245* (2013.01); *H01L 2224/33181* (2013.01);
(Continued)

(58) Field of Classification Search
CPC ....... H01L 23/02; H01L 23/04; H01L 23/051; H01L 23/16; H01L 23/3121; H01L 23/3675; H01L 23/49541; H01L 24/32; H01L 24/33; H01L 24/40; H01L 24/73
See application file for complete search history.

(56) References Cited

U.S. PATENT DOCUMENTS

2007/0085181 A1* 4/2007 Kroneder ................ H04L 24/48
257/678

FOREIGN PATENT DOCUMENTS

DE    10 2005 046 063 B3    3/2007
JP       2001-338567 A      12/2001
(Continued)

OTHER PUBLICATIONS

Communication dated Dec. 18, 2018, from the Japanese Patent Office in counterpart application No. 2018-048940.
(Continued)

*Primary Examiner* — Cuong Q Nguyen
(74) *Attorney, Agent, or Firm* — Sughrue Mion, PLLC; Richard C. Turner

(57) ABSTRACT

A power converting device such that an overcurrent is interrupted and damage to a power semiconductor element can be prevented is obtained. The power converting device includes a power semiconductor element, a wiring member connected to an electrode of the power semiconductor element, a bus bar that supplies power to the power semiconductor element, and a frame that houses the power semiconductor element, wherein the bus bar has a connection terminal connected to the wiring member, and a fuse portion is provided in the connection terminal.

12 Claims, 13 Drawing Sheets

(51) Int. Cl.
  *H01L 23/31*    (2006.01)
  *H01L 23/367*   (2006.01)
  *H01L 23/495*   (2006.01)
  *H01L 23/00*    (2006.01)
  *H02H 7/12*     (2006.01)
(52) U.S. Cl.
  CPC ............... *H01L 2224/40245* (2013.01); *H01L 2224/73263* (2013.01); *H01L 2924/13055* (2013.01); *H01L 2924/13091* (2013.01); *H01L 2924/14252* (2013.01); *H01L 2924/181* (2013.01)

(56)         References Cited

FOREIGN PATENT DOCUMENTS

| | | |
|---|---|---|
| JP | 2003-068967 A | 3/2003 |
| JP | 2005-175439 A | 6/2005 |
| JP | 2007-123644 A | 5/2007 |
| JP | 2008-235502 A | 10/2008 |
| JP | 2009-218275 A | 9/2009 |
| JP | 2011-222684 A | 11/2011 |
| JP | 2015-185702 A | 10/2015 |
| JP | 2017-188681 A | 10/2017 |

OTHER PUBLICATIONS

Office Action dated Jul. 1, 2019 in German Application No. 10 2018 221 632.0.

* cited by examiner

POWER CONVERTING DEVICE

BACKGROUND OF THE INVENTION

Field of the Invention

The present invention relates to a power converting device applied to, for example, an automobile, and in detail, relates to a power converting device such that a short-circuit current when a component short-circuit failure occurs is interrupted.

Description of the Related Art

In recent years, vehicles driven by a motor, such as a hybrid vehicle or an electric vehicle, are being developed apace in the automobile industry. A power converting device that drives a motor supplies a high voltage driving power to a motor driving circuit, with a battery as a power source. Also, a resin-sealed power semiconductor element is used in the power converting device, and the importance of the power converting device as a key device in the field of power electronics is further increasing.

Herein, a power semiconductor element used in a power converting device is resin-sealed together with other components. This kind of power converting device is such that when there s a short-circuit failure of the power semiconductor element, or of an electronic part such as a smoothing capacitor configuring a snapper circuit, in a state in which power is supplied from the battery, an excessive short-circuit current flows. For example, when there is a short-circuit of upper and lower arms of the power converting device due to a malfunction of a gate driving circuit in a control circuit, an overcurrent flows into the power semiconductor element, and a short-circuit failure occurs.

When a relay linking the battery and the motor driving circuit is connected, or a connection is continued, in a short-circuited state, the power converting device is damaged by the large current. Also, it is conceivable that the battery connected to the power converting device is damaged due to a flow of an overcurrent exceeding a rated current. Normally, in order to avoid such a situation, current is interrupted by controlling switching of the power semiconductor element at a high speed when an overcurrent flows, using a sensor that detects an overcurrent. However, more reliably preventing a failure mode such as the heretofore described damage, even when a power semiconductor element short-circuit failure occurs, is desirable.

Specifically, for example, an overcurrent flowing between the power converting device and the battery can be prevented by an overcurrent interrupting fuse being inserted between the power semiconductor element and the battery.

However, a chip type overcurrent interrupting fuse is expensive. Because of this, there is a need for overcurrent interrupting means that is inexpensive, and which can reliably interrupt an overcurrent that may flow into the battery when a power semiconductor element short-circuit occurs. Technology disclosed in, for example, Patent Document 1 is such that a fuse portion is provided by an external connection electrode protruding from a semiconductor device to an exterior being cut away, thereby reducing a sectional area.

Patent Document 1: JP-A-2003-68967

However, the technology disclosed in Patent Document 1 is such that when the fuse portion provided in the external connection electrode fuses due to an overcurrent, heat generated in the fuse portion is not discharged to the external air because the vapor is of low thermal conductivity, but is transmitted to the power semiconductor element via the external connection electrode, and there is concern that the power semiconductor element will be damaged.

Furthermore, when current flows into the power semiconductor element at a time of normal operation, the temperature of the power semiconductor element rises due to the fuse portion provided in the external connection electrode generating heat. Consequently, the temperature of the power semiconductor element is high in comparison with a case in which no fuse portion is provided, and there is concern that the power semiconductor element will exceed a tolerable temperature and be damaged.

SUMMARY OF THE INVENTION

The invention, which discloses technology for resolving the heretofore described kinds of problem, has an object of providing a power converting device such that an overcurrent is interrupted, and damage to a power semiconductor element can be prevented.

A power converting device disclosed in the invention includes a power semiconductor element, a wiring member connected to an electrode of the power semiconductor element, a bus bar that supplies power to the power semiconductor element, and a frame that houses the power semiconductor element, wherein the bus bar has a connection terminal connected to the wiring member, and a fuse portion on is provided in the connection terminal.

According to the power converting device disclosed in the invention, a fuse portion is formed in a bus bar, because of which there is no need to provide an expensive fuse, and a cost of the fuse portion can be reduced. Also, as heat generated when the fuse portion fuses is not transmitted to a power semiconductor element, damage to the power semiconductor element can be prevented. Furthermore, when changing specifications of the fuse portion, it is sufficient that only a form of a connection terminal provided in the bus bar is changed, meaning that changing the fuse portion specifications is easy.

The foregoing and other objects, characteristics, aspects, and advantages of the invention will become more apparent from the following detailed description of the invention when taken in conjunction with the accompanying drawings.

DETAILED DESCRIPTION OF THE PREFERRED EMBODIMENTS

Herein, using the drawings, preferred embodiments of a power converting device according to the invention will be described, but the same reference signs are allotted to identical or corresponding portions is the drawings, and a description thereof is omitted. Each drawing is independent with regard to sizes or scales of corresponding components shown therein.

First Embodiment

Figure 1:
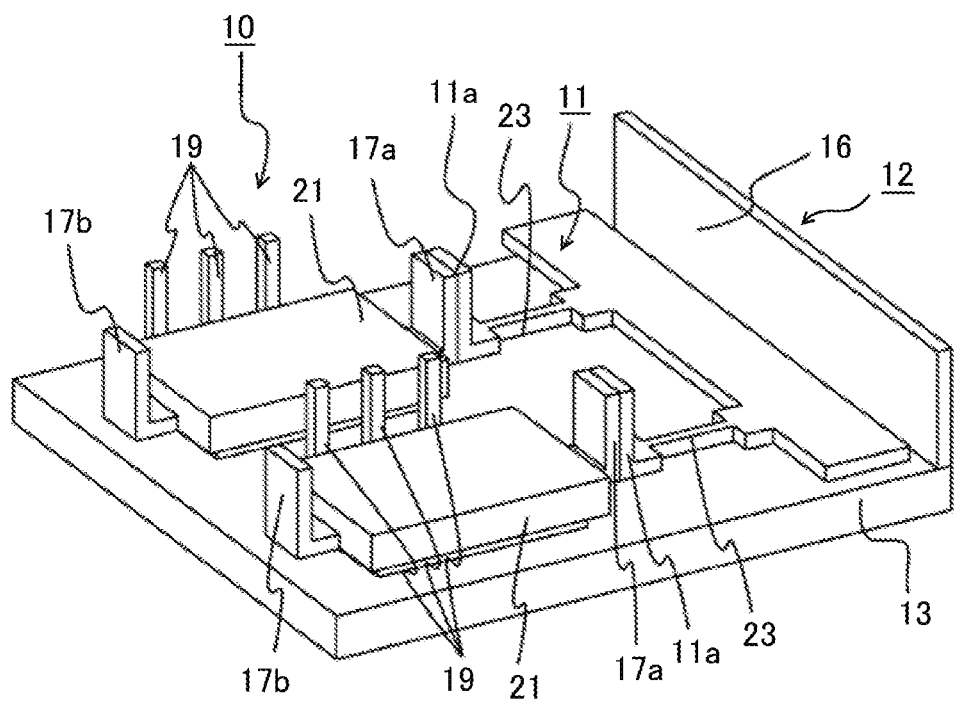
FIG. 1 is a perspective view of a power converting device according to a first embodiment.
Figure 2:
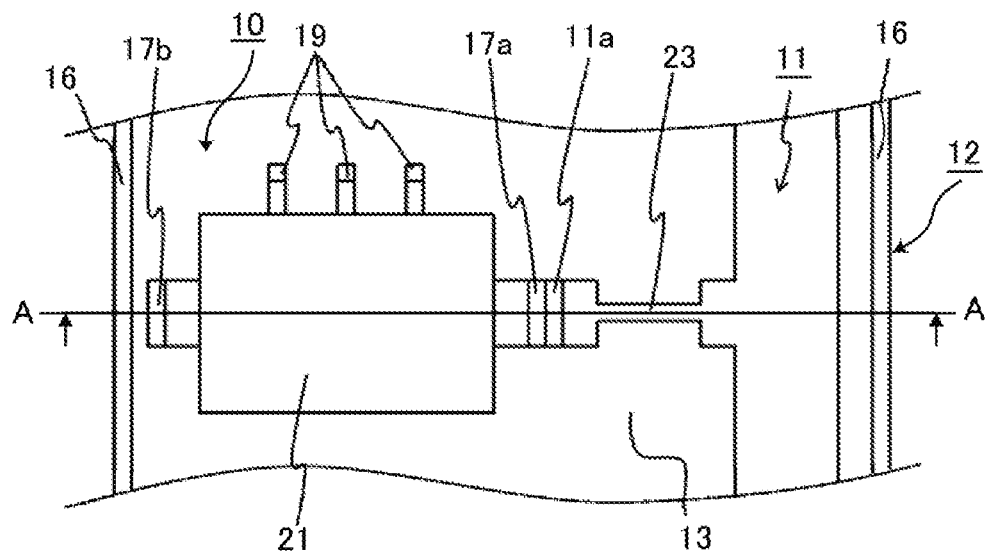
FIG. 2 is a top view showing one portion of FIG. 1.
Figure 3:
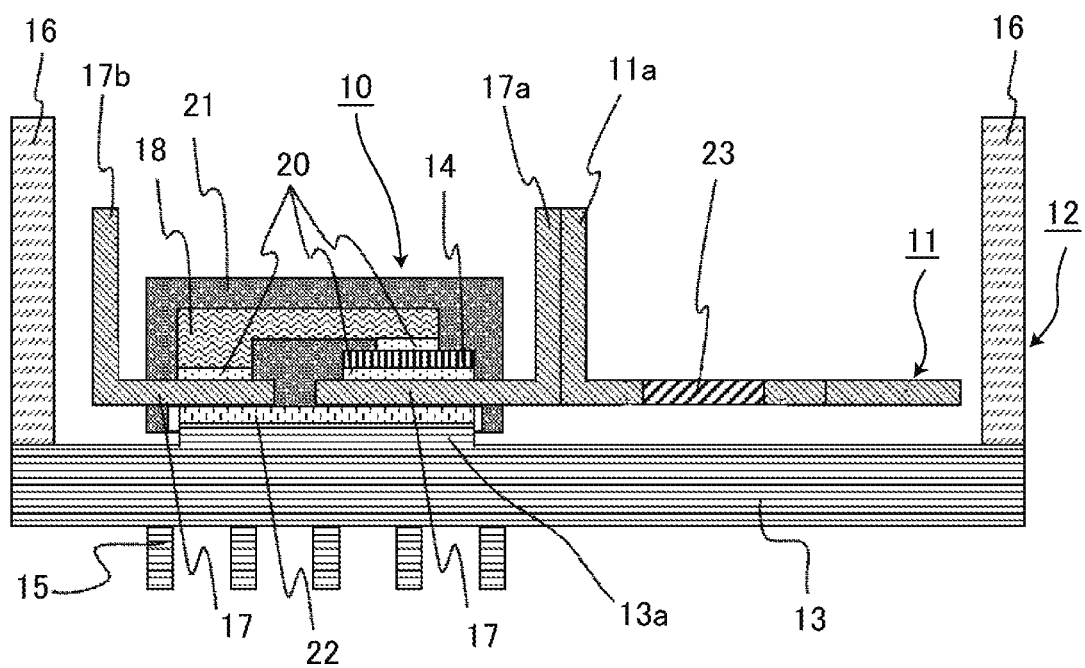
FIG. 3 is a sectional view along a line A-A of FIG. 2.

FIG. 1 is a perspective view of a power converting device according to a first embodiment. Also, FIG. 2 is a top view showing one portion of FIG. 1, and FIG. 3 is a sectional view along a line A-A of FIG. 2 As shown in FIGS. 1 to 3, the power converting device according to the first embodiment is configured of a multiple of power converting modules 10, a bus bar 11, and a frame 12.

The frame 12 is formed in a bottomed cylindrical form. Hereafter, describing simply as "inside" or "an inner side", or "outside" or an "outer side", is taken to mean an inner side or an outer side of the frame 12. "A vertical direction" is taken to mean a direction in which a cylinder portion of the frame 12 extends, and "a horizontal direction" is taken to mean a direction in which a bottom portion of the frame 12 extends.

The bottom portion of the frame 12 is configured of a metal heatsink 13. A power semiconductor element 14 (refer to FIG. 3) to be described hereafter is mounted on the heatsink 13, and the heatsink 13 has a role of dissipating heat generated in the power semiconductor element 14 to an exterior. A material having thermal conductivity of 20 W/(m·K) or more, such as a pure metal such as aluminum, iron, or copper, an aluminum alloy, an iron alloy, or a copper alloy, is used for the heatsink 13. The heatsink 13 is formed in a rectangular plate form. As shown in FIG. 3, a plate form element-facing protruding portion 13a that protrudes inward is provided in an inner face portion of the heatsink 13 facing a member on the power semiconductor element 14 side, and an inner face of the element-facing protruding portion 13a comes into contact with the member on the power semiconductor element 14 side. A multiple of plate form fins 15 arrayed with intervals between are provided on an outer face of the heatsink 13. The fins 15 are in contact with external air, and the heatsink 13 dissipates heat toward the external air from the fins 15. The fins 15 may be water-cooled.

The cylinder portion of the frame 12 is configured of a case 16. The case 16 is formed using an arbitrary resin material that has high insulating properties and is thermoplastic, for example, a resin material such as polybutylene terephthalate (PBT) polyphenylene sulfide (PPS), or polyetheretherketone (PEEK). Also, when insulation is unnecessary, the case 16 is formed using a pure metal such as aluminum, iron, or copper, an aluminum alloy, an iron alloy, a copper alloy, or the like.

The power converting module 10 includes a wiring member 17 formed in a wiring pattern, the power semiconductor element 14, which is capable of a switching action, a semiconductor element wiring member 18, a control terminal 19, a conductive joining material 20, and a molded resin 21. The semiconductor element wiring member 18 electrically connects terminals of the wiring member 17, and the wiring member 17 and the power semiconductor element 14. The conductive joining material 20 joins the wiring member 17, the power semiconductor element 14, and the semiconductor element wiring member 18. The molded resin 21 seals the wiring member 17, the power semiconductor element 14, the semiconductor element wiring member 18, the conductive joining material 20, and other mounted parts (not shown).

The heatsink 13 is provided on the power converting module 10 across a heat dissipating member 22 having electrically insulating properties. As the heat dissipating member 22 is provided between the heatsink 13 and the power semiconductor element 14, the power semiconductor element 14 and heatsink 13 are electrically isolated. Meanwhile, heat generated in the power semiconductor element 14 is transmitted to the heatsink 13 via the heat dissipating member 22. Consequently, the power semiconductor element 14 and the heatsink 13 are thermally connected. The heatsink 13 efficiently dissipates heat generated in the power semiconductor element 14 to the external air.

In this way, the power converting module 10 is fixed in a state electrically isolated from and thermally connected to the heatsink 13 across the heat dissipating member 22. Also, the heatsink 13 may have an insulating layer in a face facing a fixing portion of the power converting module 10, and be fixed to the power converting module 10 by soldering, across thermal grease, or the like.

A metal with good electrical conductivity and high thermal conductivity, such as copper, aluminum, a copper alloy, or an aluminum alloy, is used for the bus bar 11 and the wiring member 17. A surface of the wiring member 17 may be plated with a metal material such as gold, nickel, or tin. A large current of in the region of several amperes to several hundred amperes flows into the bus bar 11 and the wiring member 17. Surfaces of the wiring member 17 and the bus bar 11 may be plated with a metal material such as gold, nickel, or tin.

As shown in FIGS. 1 and 2, the control terminal 19 of the power converting module 10 and a positive electrode side wiring member 17a protrude to an exterior of the molded resin 21. The control terminal 19 is a gate signal line, a sensor signal line, or the like, of the power semiconductor element 14. The control terminal 19 is connected to a control substrate (not shown) mounted in the power converting device. The positive electrode side wiring member 17a is provided at a leading end of the wiring member 17. A large current of in the region of several amperes to several hundred amperes flows into the positive electrode side wiring member 17a. The positive electrode side wiring member 17a is joined by welding, soldering, caulking, or the like, to a connection terminal 11a formed on the bus bar 11. The positive electrode side wiring member 17a is connected via the bus bar 11 to a power source such as a power supply device or a battery provided on the exterior.

The power semiconductor element 14 is configured of a power field-effect transistor power MOSFET (power metal-oxide-semiconductor field-effect transistor), an insulated gate bipolar transistor (IGBT), or the like. These are used in a power converting device that drives an instrument such as a motor, and control a rated current of several amperes to several hundred amperes. Silicon (Si), silicon carbide (SiC), gallium nitride (GaN), or the like, is used as a material of the power semiconductor element 14.

The power semiconductor element 14 is formed in a rectangular plate chip form, a drain terminal acting as a main electrode is provided on a face on the heatsink 13 side, and a source terminal acting as a main electrode is provided on a face on a side opposite to that of the heatsink 13. Also, a gate terminal acting as a control terminal is provided on the face on which the source terminal is provided. A sensor terminal for detecting current flowing between the main electrodes, a sensor terminal for detecting a temperature of the power semiconductor element 14, or the like, may be provided as a control terminal.

The drain terminal of the power semiconductor element 14 is connected to the wiring member 17 connected to the positive electrode side wiring member 17a, and the source terminal is connected to the wiring member 17 connected via the semiconductor element wiring member 18 to a negative electrode side wiring member 17b. As a large current flows into the semiconductor element wiring member 18, the semiconductor element wiring member 18 is formed of a processed plate material of, for example, gold, silver, copper, aluminum, a copper alloy, or an aluminum alloy, and furthermore, of a wire bond or a ribbon bond. The gate terminal and the sensor terminal are connected to the control terminal 19 using, for example, a wire bond of gold, copper, aluminum, or the like, or a ribbon bond of aluminum. The control terminal 19 is exposed in the molded resin 21, and is connected to a control device (not shown) that controls a turning on and off of the power semiconductor element 14.

The wiring member 17 is formed in a plate form. An electrode connection portion of the wiring member 17 connected to the main electrodes of the power semiconductor element 14 is joined by the conductive joining material 20 to the drain terminal on the face on the heatsink 13 side of the power semiconductor element 14. Also, the semiconductor element wiring member 18 and the wiring member 17 are also joined by the conductive joining material 20. The source terminal on the face on the side of the power semiconductor element 14 opposite to that of the heatsink 13 is joined by the conductive joining material 20 to another end of the semiconductor element wiring member 18. The conductive joining material 20 is configured of a material with good electrical conductivity and high thermal conductivity, such as a solder, a silver paste, or a conductive adhesive.

A face on the heatsink 13 side of the electrode connection portion of the wiring member 17, not being covered by the molded resin 21, is exposed on an outer side. An exposed portion of the wiring member 17 is in contact with the inner face of the element-facing protruding portion 13a of the heatsink 13 across the heat dissipating member 22, which is formed in a sheet form. Heat generated in the power semiconductor element 14 is transmitted to the heatsink 13 via the electrode connection portion of the wiring member 17 and the heat dissipating member 22. The heat dissipating member 22 is configured of a material having high thermal conductivity and high electrical insulating properties. Consequently, the heat dissipating member is configured of an adhesive, a grease, or an insulating sheet formed of a resin material such as a silicon resin, an epoxy resin, or a urethane resin, which has a thermal conductivity of, for example, 0.1 W/(m·K) to several tens of W/(m·K), and which has insulating properties. Furthermore, the heat dissipating member 22 can also be configured by combining a resin material and another material of low thermal resistance and having insulating properties, such as a ceramic substrate or a metal substrate.

Also, the face on the heatsink 13 side of the electrode connection portion of the wiring member 17 may be covered by the molded resin 21. In this case, the molded resin 21 covering the face on the heatsink 13 side of the electrode connection portion of the wiring member 17 may have a thermal conductivity differing from that of the molded resin 21 covering a face on the power semiconductor element 14 side.

Also, in order to regulate a thickness of the heat dissipating member 22, a projection (not shown) may be provided on the heatsink 13 side, or on the element-facing protruding portion 13a of the heatsink 13 side, of the molded resin 21. By the projection of the molded resin 21 being pressed against the heatsink 13 or the element-facing protruding portion 13a, the thickness of the heat dissipating member 22 can be regulated by a height of the projection, and the insulating properties and the thermal conductivity of the heat dissipating member 22 can be managed. For example, an automobile with a low breakdown voltage in which a battery of 12 V, 24 V, 48 V, or the like is used is such that a creepage distance needed in order to secure a preset withstand voltage is in the region of 10 µm. Consequently, in the case of an automobile with a low breakdown voltage, the thickness needed for insulation is reduced, because of which the projection of the molded resin 21 can be shortened, and a thickness of the power converting device can be reduced. When the heat dissipating member 22 is of a material having rigidity, and there is little change in thickness due to a pressing force, the thickness of the heat dissipating member 22 can be managed, because of which the projection of the molded resin 21 is unneeded.

Because of the projection, an interval between the wiring member 17 sealed by the molded resin 21 and the heatsink 13 can be managed, a distance between a fuse portion 23 formed in the connection terminal 11a, to be described hereafter, and the heatsink 13 can be managed, and insulating properties between the two can be managed.

After protruding from the molded resin 21, the wiring member 17 extends in a horizontal direction along an inner face of the heatsink 13, in a state maintaining an interval with the inner face of the heatsink 13, subsequently bends, and extends in a vertical direction to a side away from the heatsink 13. As previously described, the portion extending in the vertical direction to the side away from the heatsink 13, that is, the positive electrode side wiring member 17a, is joined by welding, soldering, or the like to the connection terminal 11a formed on the bus bar 11.

The negative electrode side wiring member 17b too, in the same way as the positive electrode side wiring member 17a, protrudes from the molded resin 21 of the wiring member 17, extends to the side away from the heatsink 13, and is joined by welding, soldering, or the like to an external connection terminal (not shown), and the external connection terminal is connected to another device, such as a direct current power supply negative electrode or a motor connection.

The fuse portion 23, which functions as a fuse, is formed in the connection terminal 11a protruding from the bus bar 11. In this embodiment, the fuse portion 23 is provided in a portion of the connection terminal 11a extending in the horizontal direction of the frame 12. Owing to the fuse portion 23 being provided in the bus bar 11, no additional member is needed, and cost can be reduced. Furthermore, as the fuse portion 23 is provided in the connection terminal 11a, which is one portion of the bus bar 11, a form of the fuse portion 23 can be changed regardless of a form of the power converting module 10. In this example, the fuse portion 23 is provided in a portion of the bus bar 11 extending in the horizontal direction, because of which the bus bar 11 can be restricted from being long in a direction away from the heatsink 13 (a height direction) due to the form of the fuse portion 23, and a height of the power converting device can be restricted.

Also, as the fuse portion 23 is provided in the connection terminal 11a connected to the positive electrode side wiring member 17a, current can be interrupted on an upstream side of the power semiconductor element 14. Because of this, even when there is a circuit abnormality of the power semiconductor element 14, such as a short-circuit of the power semiconductor element 14 and the frame 12, current is interrupted on the upstream side of the power semiconductor element 14, and an overcurrent can be prevented from occurring. Also, as the fuse portion 23 is provided in the connection terminal 11a connected to the positive electrode side wiring member 17a, a distance between the power semiconductor element 14 and the fuse portion 23 can be increased, and damage to the power semiconductor element 14 caused by heat generated when the fuse portion 23 fuses can be prevented.

Figures 4A, 4B:
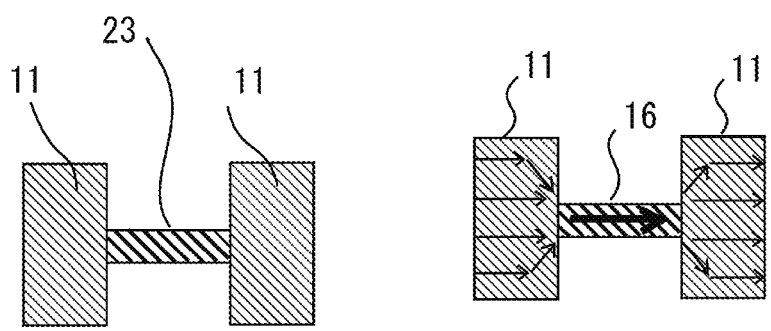
FIGS. 4A and 4B are schematic views for describing a current density of a fuse portion according to the first embodiment.
Figure 5A:
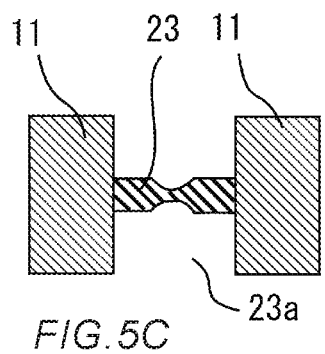
FIGS. 5A to 5D are schematic views illustrating variations of a form of the fuse portion according to the first embodiment.
Figure 5B:
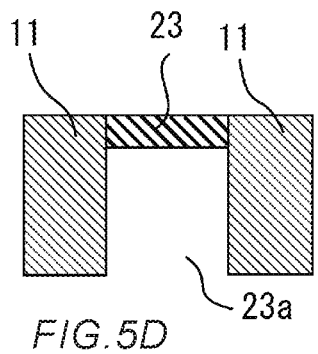
Figure 5C:
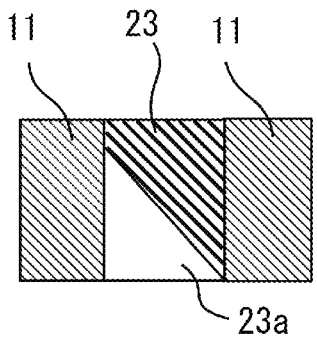
Figure 5D:
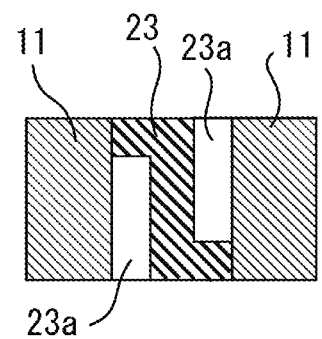
Figure 6A:
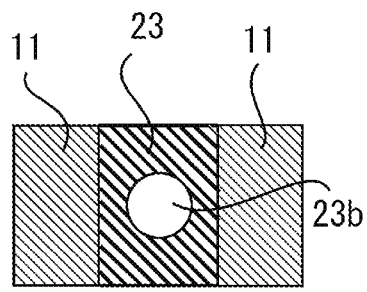
FIGS. 6A to 6E are schematic views illustrating variations of a form of the fuse portion according to the first embodiment.
Figure 6B:
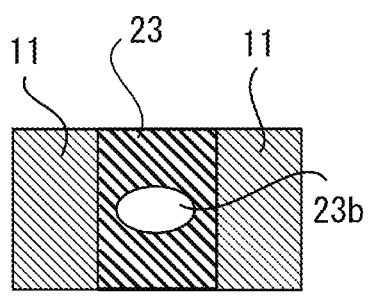
Figure 6C:
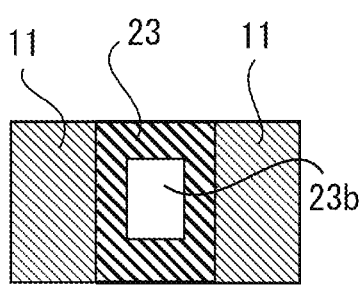
Figure 6D:
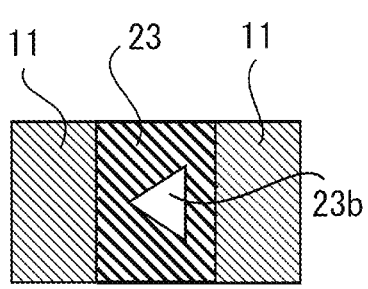
Figure 6E:
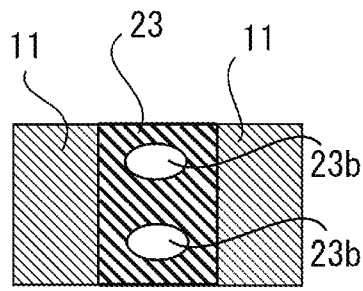

The fuse portion 23 is configured of a portion of the bus bar 11 whose sectional area is smaller than that of portions preceding and following in a current flow direction. That is, the sectional area of the fuse portion 23 is smaller than that of portions on a front side (upstream side) and back side (downstream side) in the direction in which current flows from the fuse portion 23. As shown in FIGS. 4A and 4B, a current density of the fuse portion 23, whose sectional area is smaller than that of the preceding and following portions, increases when an overcurrent flows into the bus bar 11, a temperature of the fuse portion 23 rises local and the fuse portion 23 fuses, whereby the overcurrent is interrupted. Arrows in FIG. 4B represent current. The fuse portion 23 is configured of gold, silver, copper, aluminum, a copper alloy, or an aluminum alloy, which have high electrical conductivity. The same material as for other portions of the bus bar 11 may be used for the fuse portion 23, or a different material may be used. Although not limiting, the fuse portion 23 can be formed by a punching process being carried out on a plate formed of copper or a copper alloy having a thickness of in the region of 0.5 mm to 1.5 mm, in the same way as other portions of the bus bar 11.

The fuse portion 23 may be of any form, provided that the form is such that the sectional area thereof can be decreased. For example, as shown in examples in FIGS. 5A to 5D and FIGS. 6A to 6E, the sectional area may be reduced by a cutout 23a being provided in one side or both sides, or by a through hole 23b being provided in an inner side. It is sufficient that a form of the cutout 23a or the through hole 23b is an arbitrary form such as, in addition to rectangular, triangular, pentagonal, trapezoidal, a rhombus, a parallelogram, circular, or elliptical. Not being limited to one, a multiple of the cutout 23a or the through hole 23b may be provided. Also, the multiple of cutouts 23a or through holes 23b may be disposed staggered from each other or irregularly in differing positions in a wiring length direction. The multiple of through holes 23b may be arrayed in either a width direction or the length direction of the wiring.

Figure 7:
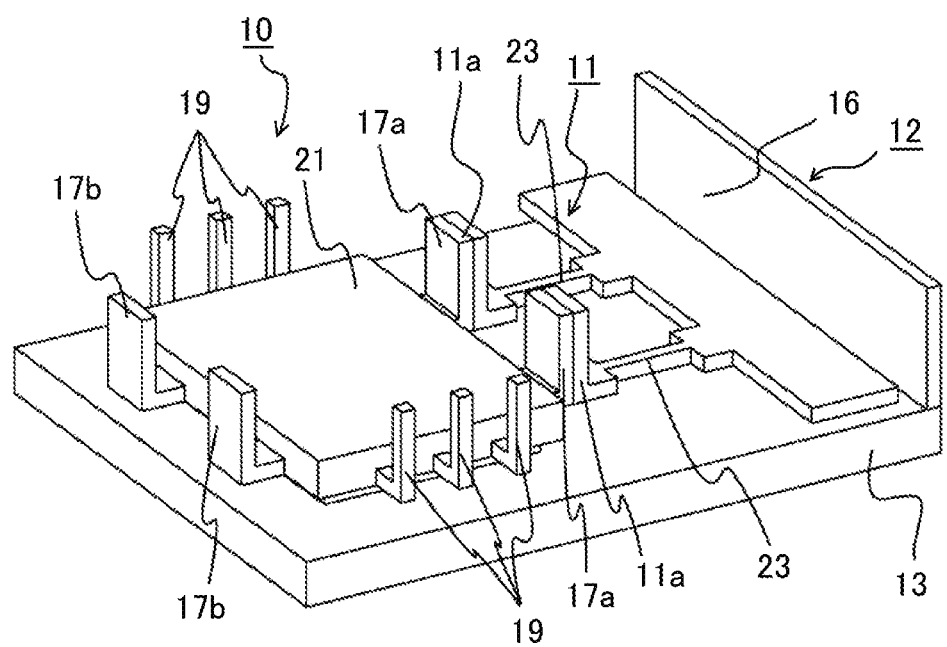
FIG. 7 is a perspective view of a power converting device according to a modification of the first embodiment.

The power converting device according to the first embodiment is configured as heretofore described, but there may also be one instead of a multiple of the power converting module 10, and a multiple of the positive electrode side wiring member 17a may be formed, as shown in FIG. 7. A multiple of the connection terminal 11a protrude from the bus bar 11, and the fuse portion 23 is provided in each connection terminal 11a. By the multiple of power converting modules 10 being changed to one power converting module, the power converting module 10 can be reduced in size.

Figure 8:
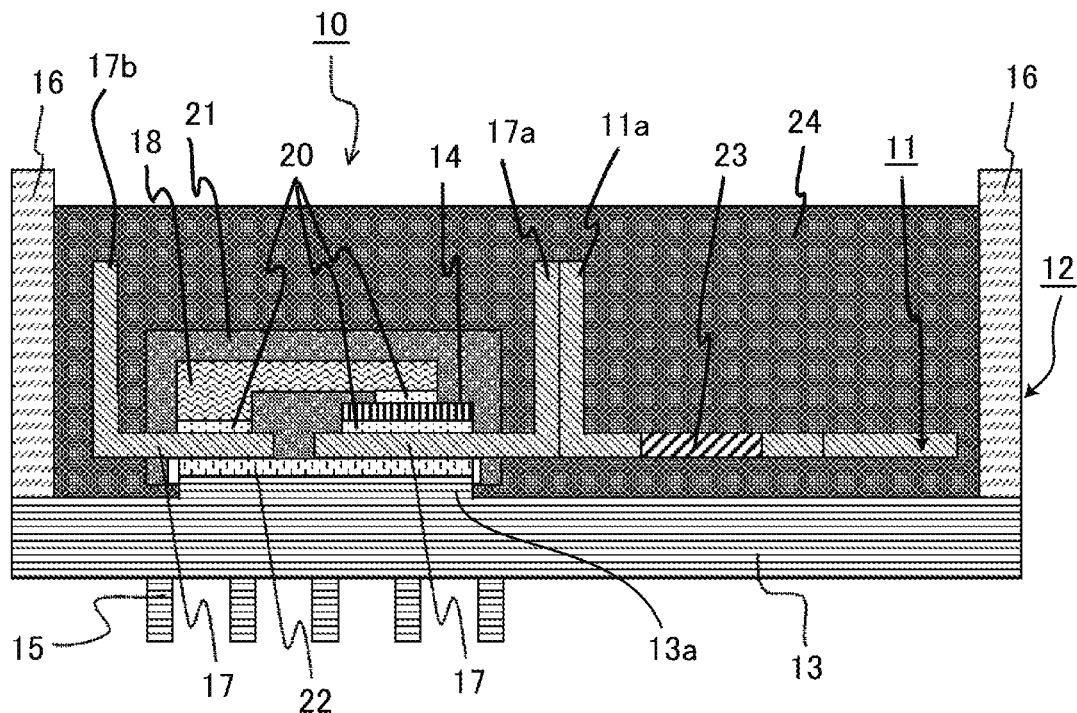
FIG. 8 is a sectional view of a power converting device according to another modification of the first embodiment.

Furthermore, an interior of the frame 12 may be filled with a sealing resin member 24, as shown in FIG. 8. The sealing resin member 24 is a resin member that seals the power semiconductor element 14, the wiring member 17, and the fuse portion 23 in the interior of the frame 12. In this embodiment, the sealing resin member 24 is configured so as to seal the power converting module 10 in the interior of the frame 12. Also, the sealing resin member 24 also seals other components, such as the heat dissipating member 22 and the bus bar 11, in the interior of the frame 12. For example, a resin material having high rigidity and high thermal conductivity is used for the sealing resin member 24. The sealing resin member 24 may be configured of, for example, an epoxy resin including a thermally conductive filler, a silicon resin, a urethane resin, PPS, PEEK, or an ABS resin. It is good when the Young's modulus of the sealing resin member 24 is 1 MPa to 50 GPa, and the thermal conductivity is 0.1 W/(m·K) to 20 W/(m·K). By each component being sealed by the sealing resin member 24, vibration resistance and environmental resistance can be increased. ABS resin is a collective name for a copolymer synthetic resin of acrylonitrile, butadiene, and styrene.

According to the power converting device according to the first embodiment, as heretofore described in detail, the fuse portion 23 is covered with the sealing resin member 24, because of which a member of the fused fuse portion 23 can be prevented from flying out to the exterior. Also, as the fuse portion 23 can be blocked off from the external air, a combustion reaction caused by an arc discharge occurring at a time of fusion can be prevented from advancing, and furthermore, smoke generated at a time of fusion can be prevented from leaking out to the exterior. Consequently, a power converting device such that an overcurrent is interrupted, and damage to a power semiconductor element is prevented, is obtained.

Second Embodiment

Next, a power converting device according to a second embodiment will be described. A basic configuration of the power converting device according to the second embodiment is the same as that in the first embodiment, but differs in that a fuse resin member is provided between a fuse portion and a heats ink configuring a frame.

Figure 9:
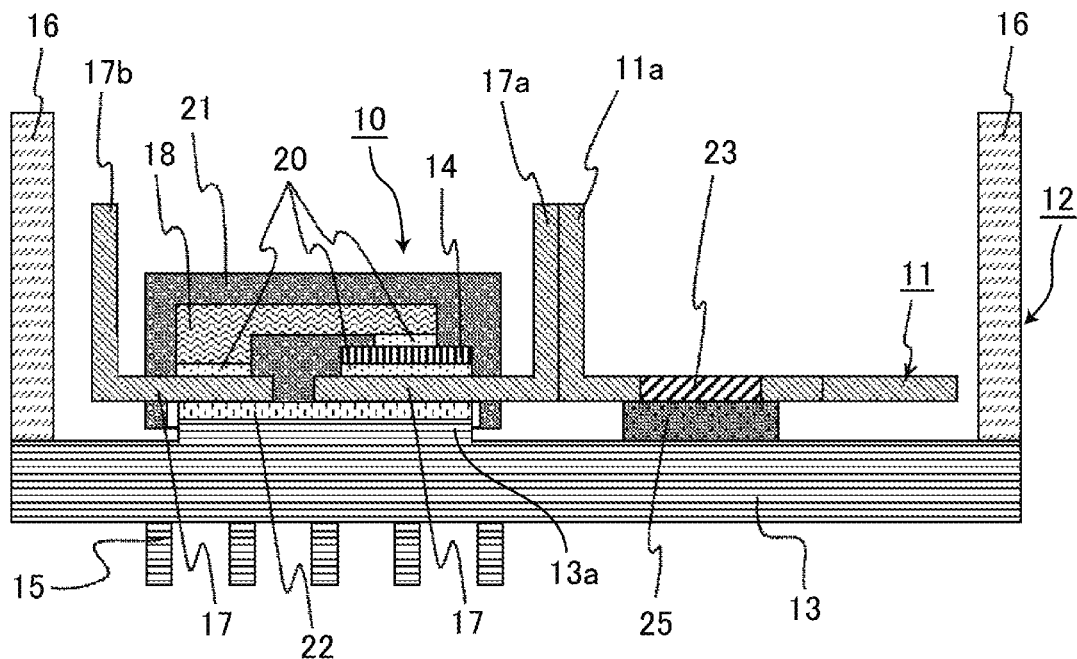
FIG. 9 is a sectional view of a power converting device according to a second embodiment.

FIG. 9 is a sectional view of the power converting device according to the second embodiment. The power converting device according to the second embodiment is such that a fuse resin member 25 is disposed between the fuse portion 23 and the heatsink 13 configuring the frame 12, as shown in FIG. 9. The fuse resin member 25 is formed to have an area greater than the area of the fuse portion 23. That is, a disposition region of the fuse resin member 25 covers at least a formation region of the fuse portion 23. The fuse resin member 25 is in contact with a face on the heatsink 13 side of the fuse portion 23, and in contact with a face on the fuse portion 23 side of the heatsink 13.

The fuse resin member 25 is configured of an adhesive, a grease, or an insulating sheet formed of a resin material such as a silicon resin, an epoxy resin, or a urethane resin, which has high electrical insulating properties. Furthermore, the fuse resin member 25 can also be configured by combining the resin material and another material of low thermal resistance and having insulating properties, such as a ceramic substrate or a metal substrate. The fuse resin member 25 may also be configured of, for example, a material having a high thermal conductivity of 1 W/(m·K) to several tens of W/(m·K) provided that the material has high electrical insulating properties.

By the fuse resin member 25 being provided between the fuse portion 23 and the frame 12, as heretofore described, a member of the fused fuse portion 23 can be prevented from coming into contact with the heatsink 13, and the fuse portion 23 and the heatsink 13 can be prevented from short-circuiting. Also, heat generated in the fuse portion 23 when fusing can be transmitted via the fuse resin member 25 to the heatsink 13 and cooled, and damage to the power semiconductor element 14 caused by generated heat can be prevented. Furthermore, as the fuse resin member 25 dedicated to the fuse portion 23 is provided, a resin member of a material appropriate to fusing of the fuse portion 23 can be selected, whereby insulating performance and cooling performance at a time of fusion can be improved.

In this embodiment, the Young's modulus of the fuse resin member 25 is taken to be, for example, in the order of several tens of megapascals (MPa) (for example, a value between 10 MPa and 30 MPa), and, for example, a rubber material, silicon rubber, or silicon gel is used. According to this configuration, when the fuse portion 23 fuses due to an overcurrent, fused members formed of a multiple of spherical masses and flying around can be caused to sink into an interior of the fuse resin member 25, which has a low Young's modulus and is soft, and dispersed and held in the interior of the fuse resin member 25. Therefore, an energization path is prevented from being maintained by a fused member after fusing, and the energization path can be swiftly cut off.

It is good when a silicon resin having an effect of extinguishing an arc discharge generated when the fuse portion 23 fuses due to an overcurrent is used for the fuse resin member 25. According to this configuration, energization being continued due to an arc discharge even after the fuse portion 23 fuses is prevented, and current can be swiftly interrupted after fusion. Consequently, damage to the power semiconductor element 14 can be prevented.

The power converting device according to the second embodiment is configured as heretofore described, but the interior of the frame 12 may be filled with the sealing resin member 24, as shown in the first embodiment. In this case, the fuse resin member 25 is disposed between the fuse portion 23 and the heatsink 13 configuring the frame 12 before the interior of the frame 12 is filled with the sealing resin member 24.

Figure 10:
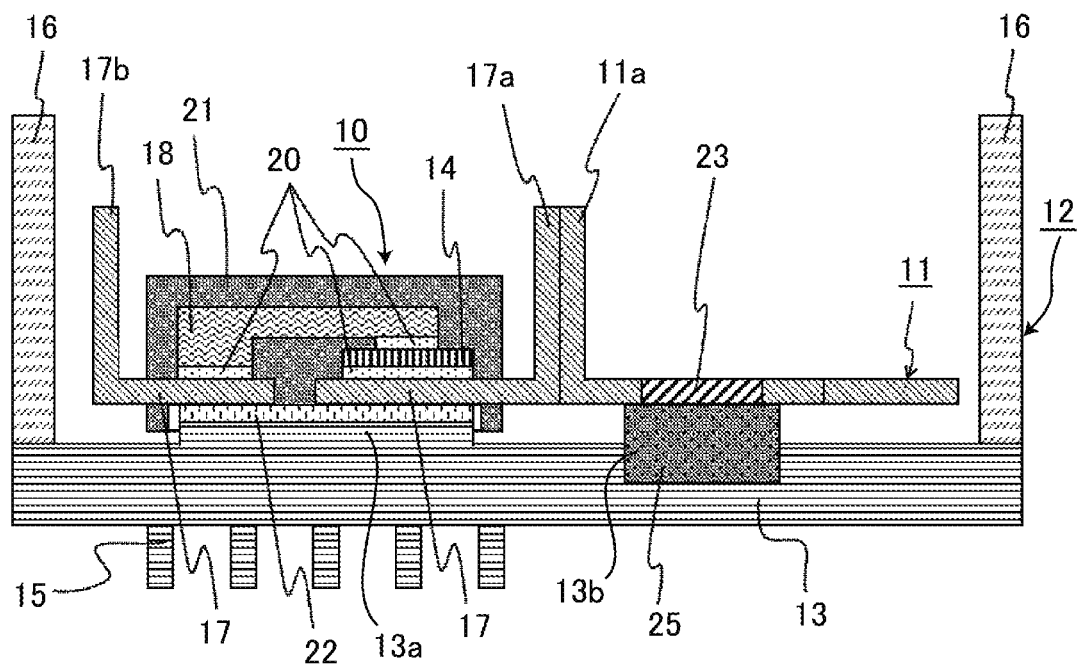
FIG. 10 is a sectional view of a power converting device according to a modification of the second embodiment.

Furthermore, as shown in FIG. 10, a depressed portion 13b may be provided in a direction away from the fuse portion 23 in a place in the heatsink 13 in which the fuse resin member 25 is disposed. An area of the depressed portion 13b is equivalent to a disposition area of the fuse resin member 25. Owing to the depressed portion 13b provided in the heatsink 13, the fuse resin member 25 can be positioned, and the fuse portion 23 and the fuse resin member 25 can reliably be brought into contact.

Figure 11:
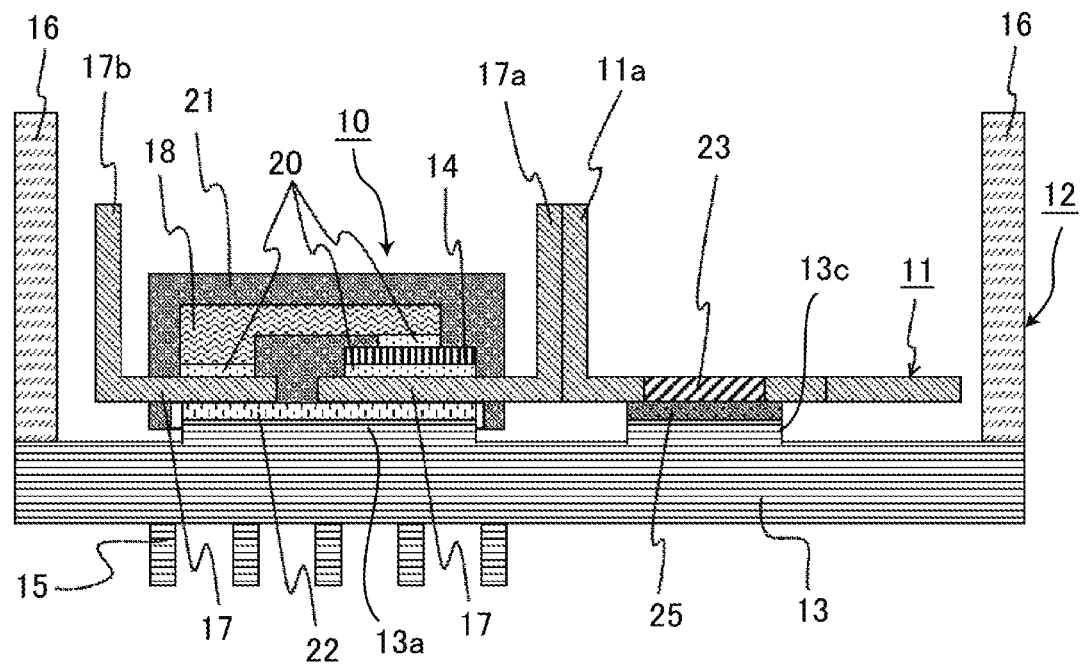
FIG. 11 is a sectional view of a power converting device according to another modification of the second embodiment.

Also, as shown in FIG. 11, a protruding portion 13c may be provided in a direction approaching the fuse portion 23 in a place in the heatsink 13 in which the fuse resin member 25 is disposed. The protruding portion 13c is formed in a plate form, and an area thereof is equivalent to the disposition area of the fuse resin member 25. Owing to the protruding portion 13c of the heatsink 13, an interval between the fuse portion 23 on which the fuse resin member 25 is disposed and the heatsink 13 can be reduced, and heat conduction from the fuse portion 23 to the heatsink 13 can be further improved. Because of this, the effect of preventing damage to the power semiconductor element 14 due to heat generated by fusion can be further increased. Also, thermal conductivity and insulating properties can be balanced by regulating a height to which the protruding portion 13c of the heatsink 13 protrudes. Both the depressed portion 13b shown in FIG. 10 and the protruding portion 13c shown in FIG. 11 may be provided in a place in the heatsink 13 in which the fuse resin member 25 is disposed.

According to the power converting device according to the second embodiment, as heretofore described, insulating performance and cooling performance when the fuse portion 23 fuses can be improved, in addition to obtaining the same advantages as in the first embodiment.

Third Embodiment

Next, a power converting device according to a third embodiment will be described. A basic configuration of the power converting device according to the third embodiment is the same as that in the first embodiment, but differs in that a fuse resin member is provided in a periphery of a fuse portion.

Figure 12:
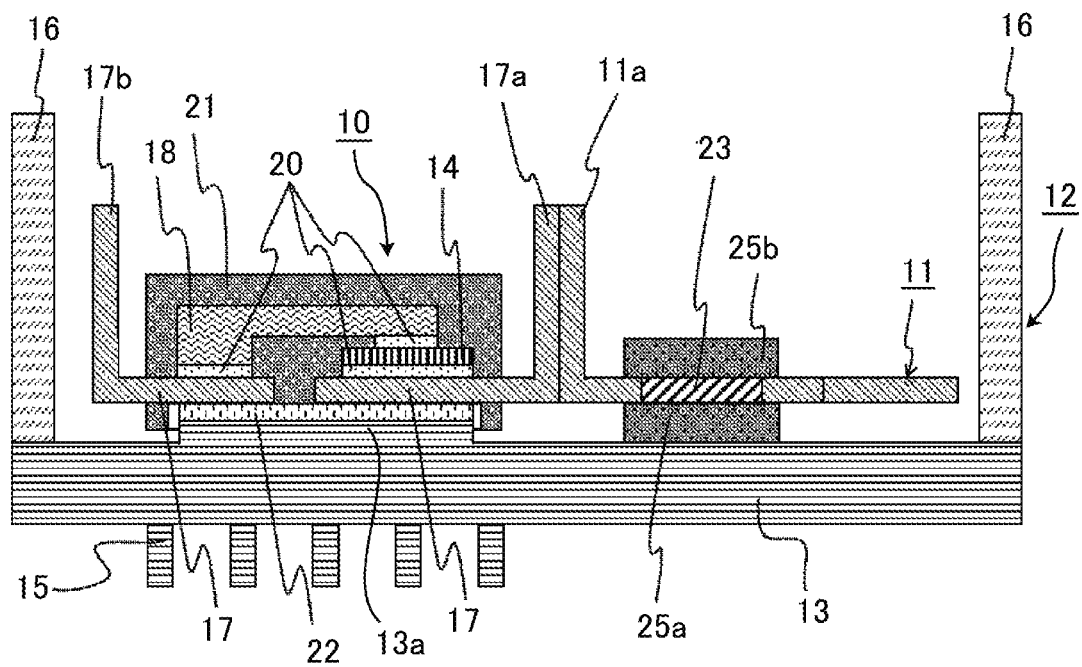
FIG. 12 is a sectional view of a power converting device according to a third embodiment.

FIG. 12 is a sectional view of the power converting device according to the third embodiment. The power converting device according to the third embodiment is such that, as shown in FIG. 12, a first fuse resin member 25a is disposed between the fuse portion 23 and the heatsink 13 configuring the frame 12, and a second fuse resin member 25b is disposed on a face of the fuse portion 23 on a side opposite to that of a face opposing the heatsink 13. The fuse portion 23 is covered by the first fuse resin member 25a and the second fuse resin member 25b, and thus cut off from the external air.

The first fuse resin member 25a and the second fuse resin member 25b are configured of the same resin material as the fuse resin member 25 described in the second embodiment, wherein, for example, the Young's modulus is taken to be in the order of several tens of megapascals (MPa) (for example, a value between 10 MPa and 30 MPa), and a rubber material, silicon rubber, silicon gel, or the like is used.

According to this configuration, when the fuse portion 23 fuses due to an overcurrent, fused members formed of multiple of spherical masses and flying around can be caused to sink into interiors of the first fuse resin member 25a and the second fuse resin member 25b, which have a low Young's modulus and are soft, and dispersed and held. Therefore, an energization path is prevented from being maintained by a fused member after fusing, and the energization path can be swiftly cut off.

Figure 13:
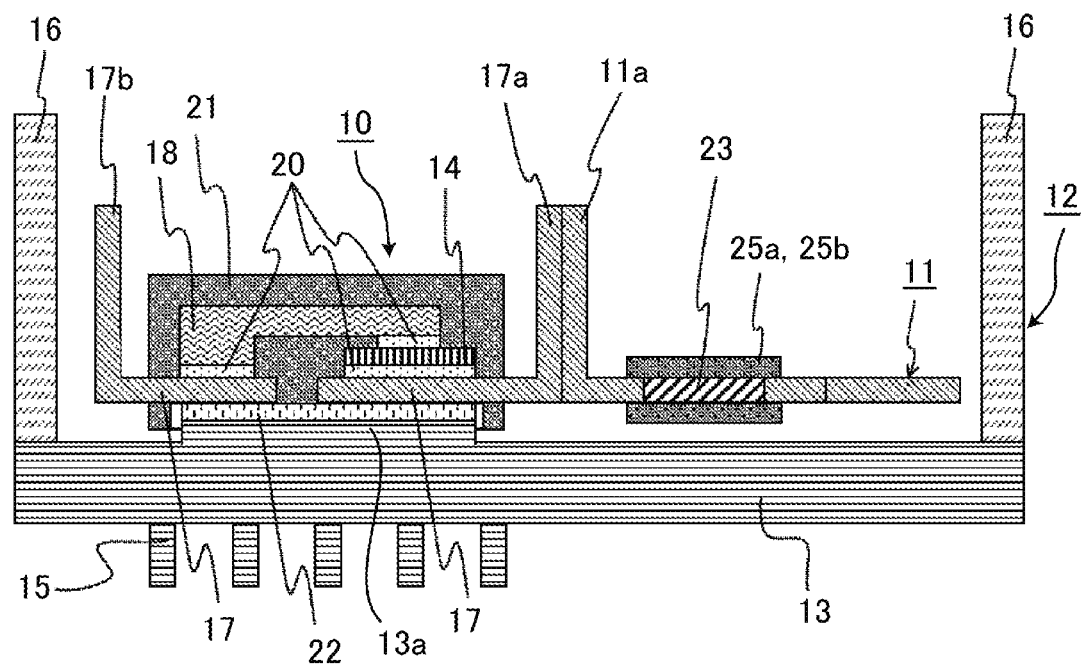
FIG. 13 is a sectional view of a power converting device according to a modification of the third embodiment.

The power converting device according to the third embodiment is configured as heretofore described, but as shown in FIG. 13, the fuse portion 23 may be covered by one only of the first fuse resin member 25a or the second fuse resin member 25b, that is, by the first fuse resin member 25a and the second fuse resin member 25b being configured of the same member. Also, the first fuse resin member 25a need not be in contact with the heatsink 13. For example, when the first fuse resin member 25a is formed on the bus bar 11 by direct coating or injection molding so as to cover the fuse portion 23, the fuse portion 23 can be covered by the first fuse resin member 25a before the bus bar 11 is assembled in the frame 12, whereby the fuse portion 23 can be prevented from being damaged when assembling.

Also, in the third embodiment too, the interior of the frame 12 may be filled with the sealing resin member 24 (refer to FIG. 8), in the same way as in the first embodiment. In this case, the first fuse resin member 25a and the second fuse resin member 25b are disposed before the interior of the frame 12 is filled with the sealing resin member 24. Also, the depressed portion 13b may be provided in the heatsink 13, as shown in FIG. 10, or the protruding portion 13c may be provided in the heatsink 13, as shown in FIG. 11, on an inner side enclosed by the first fuse resin member 25a and the second fuse resin member 25b. Furthermore, both the depressed portion 13b and the protruding portion 13c may be provided.

According to the power converting device according to the third embodiment, as heretofore described, insulating performance and cooling performance when the fuse portion 23 fuses can be further improved, in addition to obtaining the same advantages as in the first embodiment.

Fourth Embodiment

Next, a power converting device according to a fourth embodiment will be described. A basic configuration of the power converting device according to the fourth embodiment is the same as that in the third embodiment, but one portion of a configuration of a fuse resin member in a periphery of a fuse portion is different.

Figure 14:
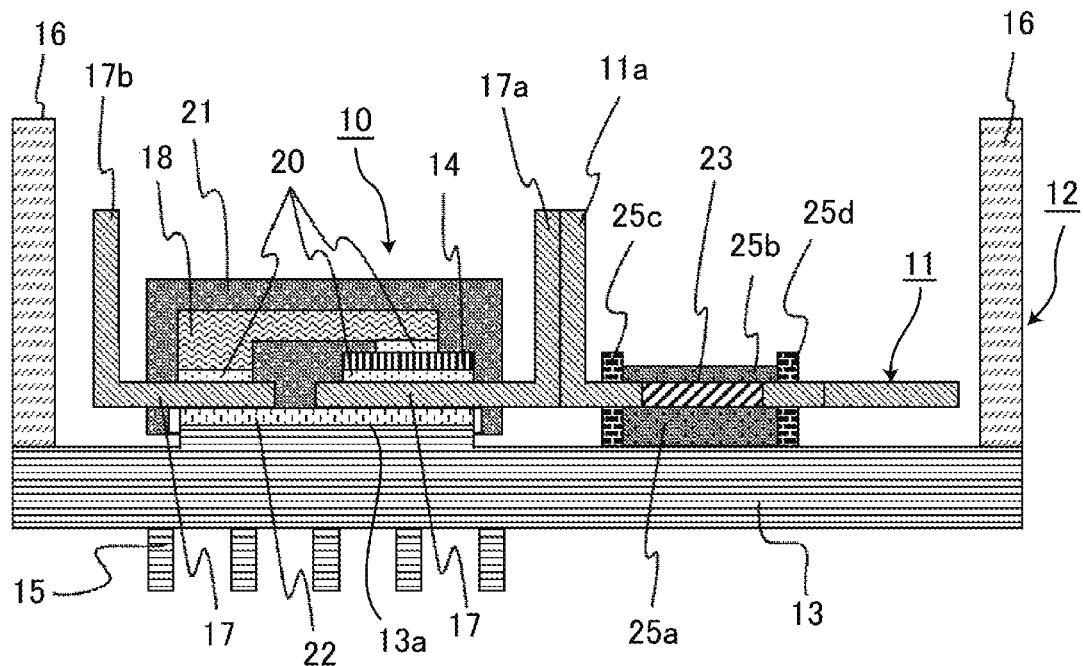
FIG. 14 is a sectional view of a power converting device according to a fourth embodiment.

FIG. 14 is a sectional view of the power converting device according to the fourth embodiment. A third fuse resin member 25c and a fourth fuse resin member 25d are disposed on the heatsink 13 so as to enclose the fuse portion 23. An inner side enclosed by the third fuse resin member 25c, the fourth fuse resin member 25d, and the heatsink 13 is filled with the first fuse resin member 25a and the second fuse resin member 25b, thus covering the fuse portion 23. The third fuse resin member 25c and the fourth fuse resin member 25d may be simply placed on the heatsink 13, or may be fixed to the heatsink 13 using an adhesive, caulking, welding, or the like.

The configuration is such that the first fuse resin member 25a and the second fuse resin member 25b do not leak to an outer side of the third fuse resin member 25c and the fourth fuse resin member 25d. The third fuse resin member 25c and the fourth fuse resin member 25d are formed using, for example, an arbitrary resin material that has high insulating properties and is thermoplastic, for example, a resin material such as polybutylene terephthalate (PBT), polyphenylene sulfide (PPS), or polyetheretherketone (PEEK), but it is not necessary that each is configured of the same resin material. Also, the first fuse resin member 25a and the second fuse resin member 25b too may each be configured of a different material, or may be configured of the same material.

According to this configuration, the fuse portion 23 is enclosed by the third fuse resin member 25c and the fourth fuse resin member 25d, because of which the fuse portion 23 can reliably be covered by the first fuse resin member 25a and the second fuse resin member 25b. Furthermore, when the fuse portion 23 fuses due to an overcurrent, fused members formed of a multiple of spherical masses can be prevented from flying around by the third fuse resin member 25c and the fourth fuse resin member 25d. Therefore, an energization path is prevented from being maintained by a fused member after fusing, and the energization path can be swiftly cut off.

The power converting device according to the fourth embodiment is configured as heretofore described, but the interior of the frame 12 may be filled with the sealing resin member 24 (refer to FIG. 8), as shown in the first embodiment. In this case, the first fuse resin member 25a and the second fuse resin member 25b are disposed before the interior of the frame 12 is filled with the sealing resin member 24. Also, the depressed portion 13b may be provided in the heatsink 13, as shown in FIG. 10, on the inner side enclosed by the third fuse resin member 25c and the fourth fuse resin member 25d. Furthermore, the protruding portion 13c may be provided in the heatsink 13, as shown in FIG. 11. Furthermore, both the depressed portion 13b and the protruding portion 13c may be provided.

Figure 15:
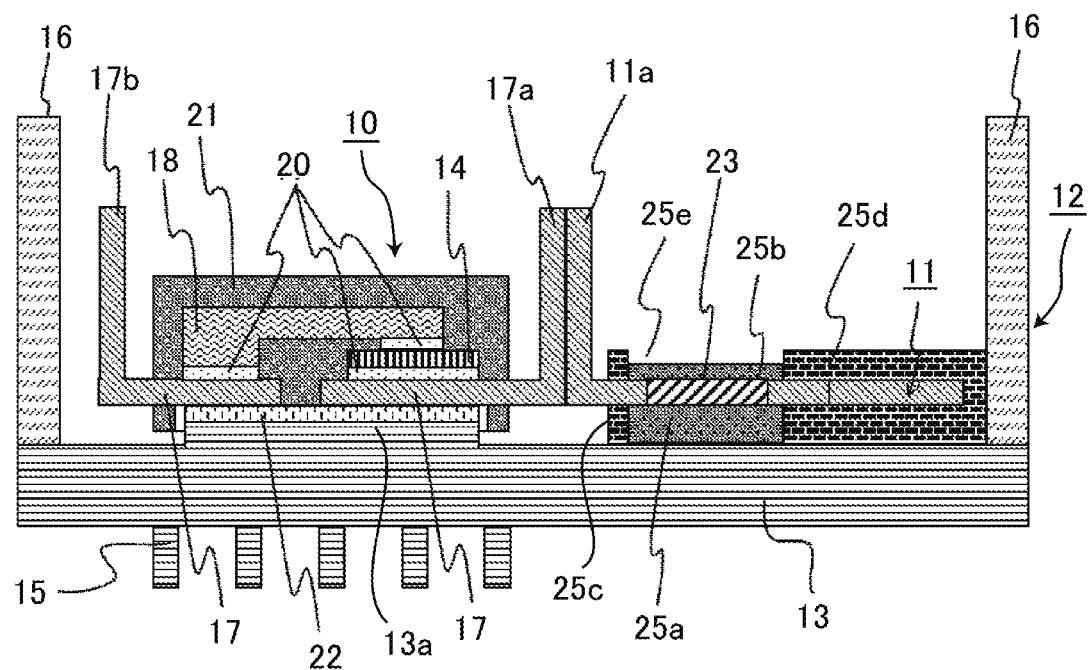
FIG. 15 is a sectional view of a power converting device according to a modification of the fourth embodiment.
Figure 16:
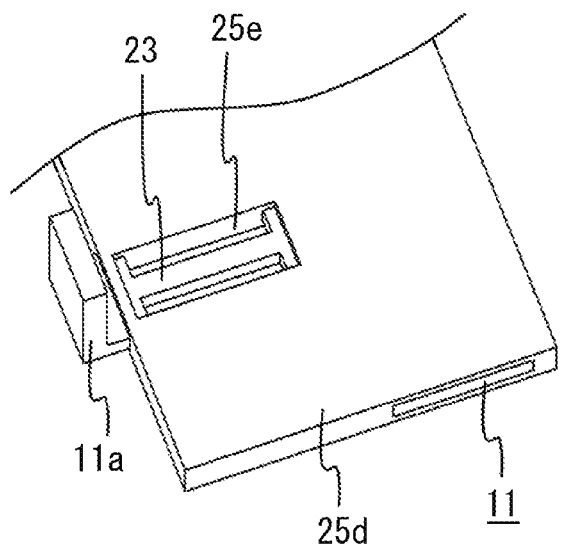
FIG. 16 is a partial perspective view of FIG. 15.

Also, a configuration may be such that the fourth fuse resin member 25d covers the whole of the bus bar 11, as shown in FIGS. 15 and 16. In this case, the bus bar 11 is integrally molded with the third fuse resin member 25c and the fourth fuse resin member 25d using an insert or an outsert, and the connection terminal 11a is exposed from the third fuse resin member 25c and the fourth fuse resin member 25d. Furthermore, an aperture portion 25e such that causes the whole of the fuse portion 23 to be exposed is configured in the third fuse resin member 25c and the fourth fuse resin member 25d, and the first fuse resin member 25a and the second fuse resin member 25b are configured in a space configured by the aperture portion 25e and the heatsink 13. Furthermore, the case 16, the third fuse resin member 25c, and the fourth fuse resin member 25d may be configured integrally.

Figure 17:
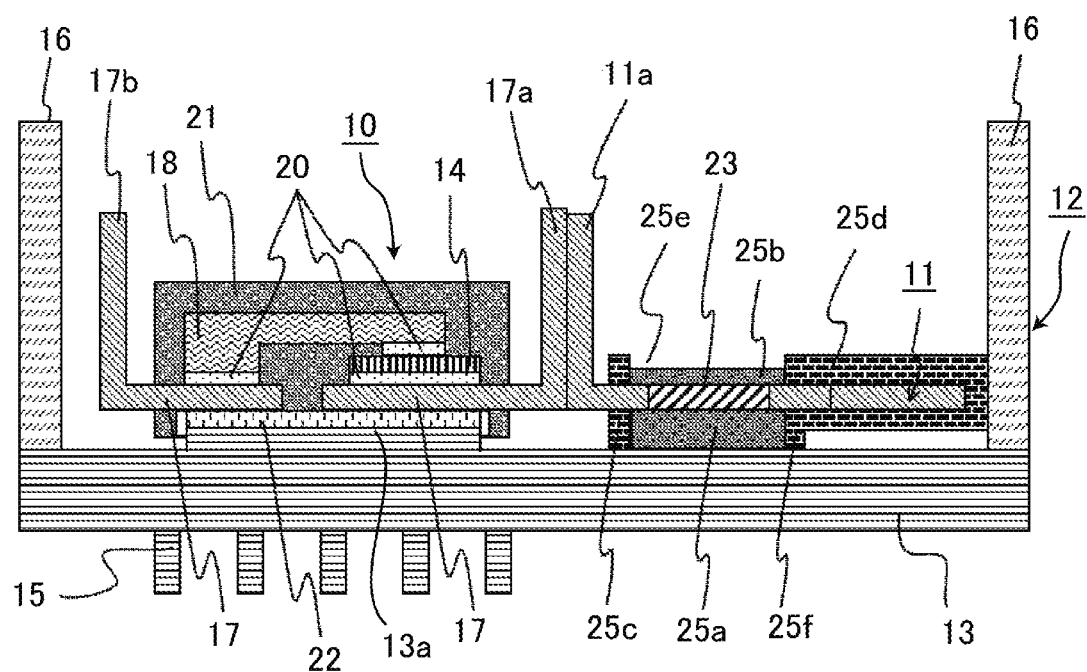
FIG. 17 is a sectional view of a power converting device according to a modification of the fourth embodiment.
Figure 18:
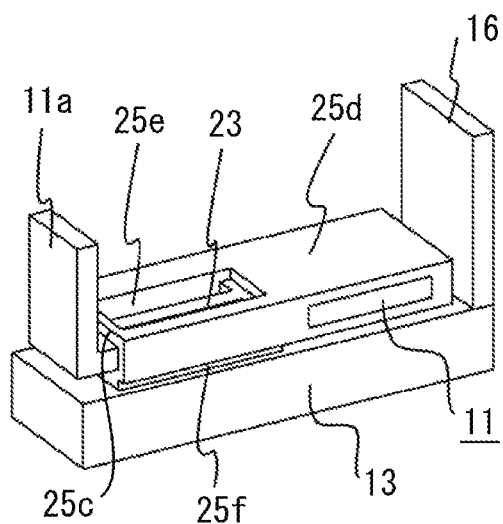
FIG. 18 is a partial perspective view of FIG. 17.

Also, a protruding portion 25f may be configured from the fourth fuse resin member 25d toward the heatsink 13, as shown in FIGS. 17 and 18. The first fuse resin member 25a is configured in a space configured by the third fuse resin member 25c, the protruding portion 25f, and the heatsink 13. The protruding portion 25f may be simply placed on the heatsink 13, or may be fixed to the heatsink 13 using an adhesive, caulking, welding, or the like. By the protruding portion 25f being provided, the space configured by the third fuse resin member 25c, the protruding portion 25f, and the heatsink 13 can reliably be formed.

According to the power converting device according to the fourth embodiment, as heretofore described, insulating performance and cooling performance when the fuse portion 23 fuses can be further improved, in addition to obtaining the same advantages as in the first embodiment.

Fifth Embodiment

Next, a power converting device according to a fifth embodiment will be described. A basic configuration of the power converting device according to the fifth embodiment is the same as that in the fourth embodiment, but one portion of a configuration of a heatsink and of a fuse resin member in a periphery of a fuse portion is different.

Figure 19:
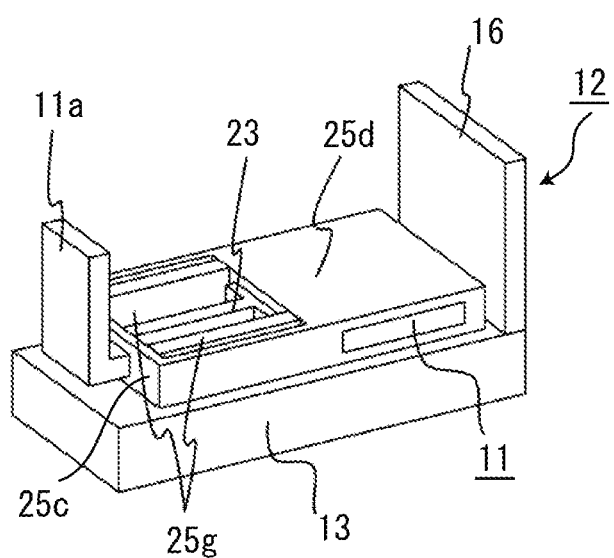
FIG. 19 is a perspective view of a power converting device according to a fifth embodiment.
Figure 20:
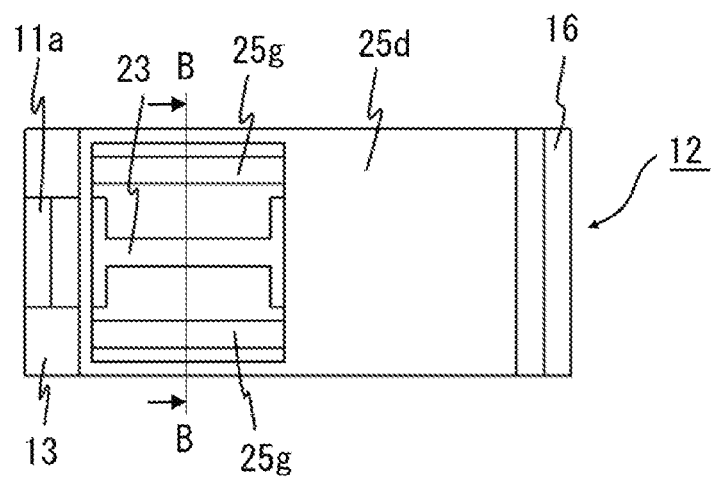
FIG. 20 is a top view of FIG. 19.

FIG. 19 is a perspective view of the power converting device according to the fifth embodiment, and FIG. 20 is a top view. As shown in FIGS. 19 and 20, the power converting device according to the fifth embodiment is such that the third fuse resin member 25c and the fourth fuse resin member 25d are disposed on the heatsink 13 so as to enclose the fuse portion 23. A multiple of projections 25g are provided facing an upper side from the heatsink 13, and the fuse portion 23 is enclosed by the third fuse resin member 25c, the fourth fuse resin member 25d, and the projections 25g.

Figure 21:
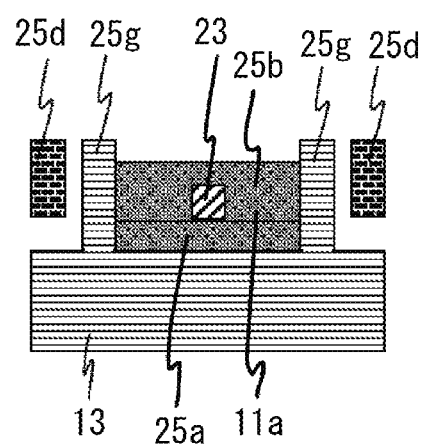
FIG. 21 is a sectional view along a line B-B of FIG. 20.

FIG. 21 is a sectional view along a line B-B of FIG. 20. The inner side enclosed by the third fuse resin member 25c, the fourth fuse resin member 25d, and the heatsink 13 is filled with the first fuse resin member 25a and the second fuse resin member 25b, whereby the fuse portion 23 can reliably be covered. The first fuse resin member 25a and the second fuse resin member 25b, and the third fuse resin member 25c and the fourth fuse resin member 25d, are configured of the same or differing materials, in the same way as in the fourth embodiment.

The power converting device according to the fifth embodiment being configured as heretofore described means that when the fuse portion 23 fuses due to an overcurrent, fused members formed of a multiple of spherical masses can be prevented from flying around by the first fuse resin member 25a, the second fuse resin member 25b, the third fuse resin member 25c, the fourth fuse resin member 25d, and the projections 25g. Therefore, an energization path is prevented from being maintained by a fused member after fusing, and the energization path can be swiftly cut off. Also, as the projections 25g, which are one portion of the heatsink 13, are provided near the fuse portion 23, heat generated when current flows into the fuse portion 23 can be dissipated to the heatsink 13 via the first fuse resin member 25a, the second fuse resin member 25b, and the projections 25g.

The power converting device according to the fifth embodiment is configured as heretofore described, but the interior of the frame 12 may be filled with the sealing resin member 24 (refer to FIG. 8), as shown in the first embodiment. In this case, the first fuse resin member 25a and the second fuse resin member 25b are disposed between the third fuse resin member 25c and the fourth fuse resin member 25d before the interior of the frame 12 is filled with the sealing resin member 24. Also, the depressed portion 13b may be provided in the heatsink 13, as shown in FIG. 10, on the inner side enclosed by the third fuse resin member 25c and the fourth fuse resin member 25d. Furthermore, the protruding portion 13c may be provided in the heatsink 13, as shown in FIG. 11. Furthermore, both the depressed portion 13b and the protruding portion 13c may be provided.

According to the power converting device according to the fifth embodiment, as heretofore described, insulating performance and cooling performance when the fuse portion 23 fuses can be further improved, in addition to obtaining the same advantages as in the first embodiment.

Sixth Embodiment

Next, a power converting device according to a sixth embodiment will be described. A basic configuration of the power converting device according to the sixth embodiment is the same as that in the fourth embodiment, but one portion of a configuration of a fuse resin member in a periphery of a fuse portion is different.

Figure 22:
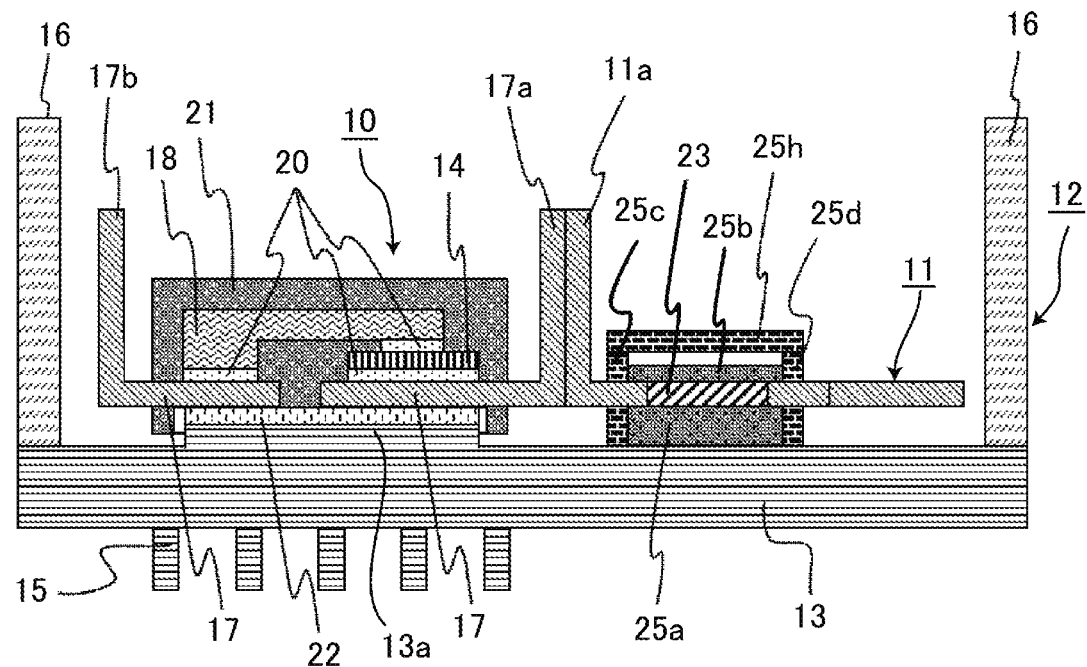
FIG. 22 is a sectional view of a power converting device according to a sixth embodiment.

FIG. 22 is a sectional view of the power converting device according to the sixth embodiment. A periphery of the fuse portion 23 is enclosed by the third fuse resin member 25c, the fourth fuse resin member 25d, and the heatsink 13, and covered by the first fuse resin member 25a and the second fuse resin member 25b. A cover member 25h having rigidity is provided on upper sides of the third fuse resin member 25c and the fourth fuse resin member 25d so as to close off a space enclosed by the third fuse resin member 25c, the fourth fuse resin member 25d, and the heatsink 13. The cover member 25h is formed of, for example, an arbitrary resin material that has high insulating properties and is thermoplastic, for example, a resin material such as polybutylene terephthalate (PBT), polyphenylene sulfide (PPS), or polyetheretherketone (PEEK), or is formed of a metal material. Also, the cover member 25h is fixed to the third fuse resin member 25c and the fourth fuse resin member 25d using, for example, caulking, an adhesive, or welding.

By the fuse portion 23 being enclosed by the rigid cover member 25h, the third fuse resin member 25c, the fourth fuse resin member 25d, and the heatsink 13, fused members formed of a multiple of spherical masses and flying around when the fuse portion 23 fuses due to an overcurrent can be prevented from penetrating the first fuse resin member 25a and the second fuse resin member 25b and flying into the interior of the frame 12. Therefore, an energization path is prevented from being maintained by a fused member after fusing, and the energization path can be swiftly cut off.

The power converting device according to the sixth embodiment is configured as heretofore described, but the interior of the frame 12 may be filled with the sealing resin member 24 (refer to FIG. 8), as shown in the first embodiment, and the fourth fuse resin member 25d may be configured so as to cover the whole of the bus bar 11, as shown in the fifth embodiment.

Figure 23:
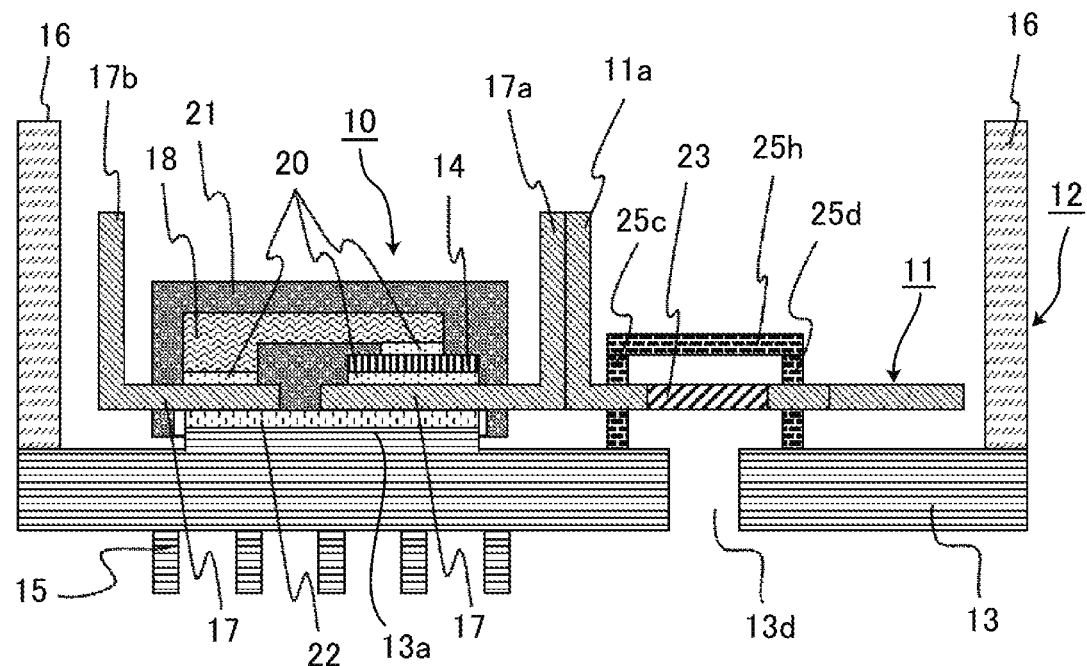
FIG. 23 is a sectional view of a power converting device according to a modification of the sixth embodiment.

Also, as shown in FIG. 23, a through hole 13d may be provided in the heatsink 13 in one portion of a space enclosed by the cover member 25h, the third fuse resin member 25c, and the fourth fuse resin member 25d. Fused members formed of a multiple of spherical masses and flying around when the fuse portion 23 fuses due to an overcurrent are discharged to the exterior of the frame 12 from the through hole 13d, whereby damage to the power converting device can be prevented, and a stable interruption effect can be obtained.

Figure 24:
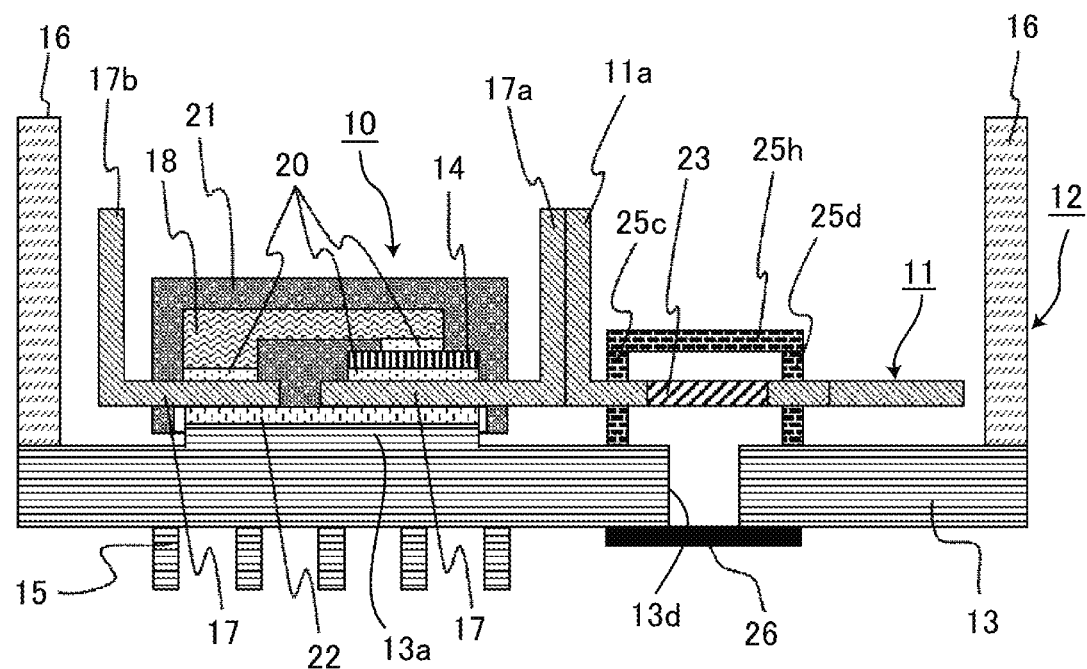
FIG. 24 is a sectional view of a power converting device according to another modification of the sixth embodiment.

Furthermore, a filter 26 may be provided so as to close off the through hole 13d of the heatsink 13, as shown in FIG. 24. The filter 26 is fixed to the heatsink 13 using an adhesive, welding, caulking, or the like, and prevents moisture from infiltrating from the exterior. The filter 26, being configured of a member distinct from the heatsink 13, is configured of, for example, a metal material such as a thin film of copper or aluminum, or a resin material such as PPS, PEEK, or ABS. Also, the filter 26 may be configured of a water-repelling filter generated using a resin material such as polytetrafluoroethylene (PTFE).

When the filter 26 separates from the heatsink 13, or one portion of the filter 26 is damaged and an aperture portion is formed, because of fused members formed of a multiple of spherical masses and flying around when the fuse portion 23 fuses due to an overcurrent, or because of energy, the fused and flying fuse portion 23 is discharged to the exterior of the frame 12, because of which damage to the power converting device can be prevented, and a stable interruption effect can be obtained.

According to the power converting device according to the sixth embodiment, as heretofore described, insulating performance and cooling performance when the fuse portion 23 fuses can be further improved, in addition to obtaining the same advantages as in the first embodiment.

Various exemplifying embodiments are described in the disclosure, but various characteristics, aspects, and functions described in one or a multiple of embodiments, not being limited to application to a specific embodiment, can be applied to the embodiments singly or in various combinations.

Consequently, a countless number of undescribed modified examples are envisaged within the range of the technology disclosed in the specification. For example, a case in which at least one component is modified, added, or eliminated, and furthermore, a case in which at least one component is extracted and combined with a component of another embodiment, are included. To give examples:

1. The power converting module 10 wherein the power semiconductor element 14 and the wiring member 17 are sealed by the molded resin 21, which is a resin member, is described as an example in each of the heretofore described embodiments. However, the embodiments of the invention are not limited to this. That is, the power semiconductor element 14 and the wiring member 17, rather than being sealed by the molded resin 21, need not be packaged. That is, the power semiconductor element 14, the wiring member 17, and the like, in a state not sealed by the molded resin 21, may be sealed in the interior of the frame 12 by the sealing resin member 24. In this case, the wiring member 17 is taken to be the bus bar 11 or the like, and the fuse portion 23 may be provided in a portion of a positive electrode side or negative electrode side electrode wiring member sealed by the sealing resin member 24.

2. Also, a case wherein the fuse portion 23 is provided in the connection terminal 11a connected to the positive electrode side wiring member 17a is described as an example in each of the heretofore described embodiments. However, the embodiments of the power converting device according to the invention are not limited to this. That is, provided that the fuse portion 23 is a portion of the bus bar 11 connected to the wiring member 17 connected to the main electrodes of the power semiconductor element 14 and sealed by the sealing resin member 24, the fuse portion 23 may be provided in any place. For example, the fuse portion 23 may be provided in a bus bar (not shown) connected to the negative electrode side wiring member 17b.

Various modifications and alterations of this invention will be apparent to those skilled in the art without departing from the scope and spirit of the invention, and it should be understood that this is not limited to the illustrative embodiments set forth herein.

What is claimed is:

1. A power converting device, comprising:
a power semiconductor element;
a wiring member connected to an electrode of the power semiconductor element;
a bus bar that supplies power to the power semiconductor element; and
a frame that houses the power semiconductor element, wherein
the bus bar has a connection terminal connected to the wiring member, and a fuse portion is provided in the connection terminal, and
wherein a fuse resin member is provided between the fuse portion and a bottom portion of the frame.

2. The power converting device according to claim 1, wherein the fuse portion is configured of a portion of the connection terminal whose sectional area is smaller than that of portions preceding and following in a direction of current flow.

3. The power converting device according to claim 1, comprising a sealing resin member that seals the power semiconductor element, the wiring member, the bus bar, and the fuse portion in an interior of the frame.

4. The power converting device according to claim 2, comprising a sealing resin member that seals the power semiconductor element, the wiring member, the bus bar, and the fuse portion in an interior of the frame.

5. The power converting device according to claim 1, wherein a fuse resin member is provided on a side of the fuse portion opposite to that of the bottom portion of the frame.

6. The power converting device according to claim 2, wherein a fuse resin member is provided on a side of the fuse portion opposite to that of the bottom portion of the frame.

7. The power converting device according to claim 1, wherein the fuse resin member is configured of a resin that extinguishes an arc discharge generated when the fuse portion fuses.

8. The power converting device according to claim 1, wherein a protruding portion protruding to the fuse portion side is provided on an inner face of the bottom portion of the frame opposing the fuse portion.

9. The power converting device according to claim 1, wherein a depressed portion depressed to a side opposite to that of the fuse portion is provided on an inner face of the bottom portion of the frame opposing the fuse portion.

10. The power converting device according to claim 1, wherein the fuse resin members enclosing the fuse portion are disposed in the frame.

11. The power converting device according to claim 1, wherein the frame is formed as a bottomed cylinder whose bottom portion is configured of a metal heatsink.

12. The power converting device according to claim 1, wherein the fuse portion is constituted of a single reduced cross section portion of the bus bar.

* * * * *